United States Patent
Good et al.

(10) Patent No.: US 6,495,475 B2
(45) Date of Patent: Dec. 17, 2002

(54) METHOD FOR FABRICATION OF A HIGH CAPACITANCE INTERPOLY DIELECTRIC

(75) Inventors: Mark A. Good, Colorado Springs, CO (US); Amit S. Kelkar, Castle Rock, CO (US)

(73) Assignee: Atmel Corporation, San Jose, CA (US)

(*) Notice: Subject to any disclaimer, the term of this patent is extended or adjusted under 35 U.S.C. 154(b) by 0 days.

(21) Appl. No.: 09/821,365

(22) Filed: Mar. 28, 2001

(65) Prior Publication Data

US 2002/0142570 A1 Oct. 3, 2002

(51) Int. Cl.[7] .............................................. H01L 21/469
(52) U.S. Cl. ........................................ 438/773; 438/787
(58) Field of Search ................................. 438/758, 778, 438/780, 787, 791, 745, 756, 757, 773

(56) References Cited

U.S. PATENT DOCUMENTS

| | | | |
|---|---|---|---|
| 4,808,261 A | 2/1989 | Ghidini et al. ............... 156/653 |
| 5,244,825 A | 9/1993 | Coleman et al. ............... 437/52 |
| 5,302,545 A | 4/1994 | Okada et al. .................. 437/53 |
| 5,324,675 A | 6/1994 | Hayabuchi .................... 437/42 |
| 5,478,765 A | 12/1995 | Kwong et al. ................. 437/40 |
| 5,504,021 A | 4/1996 | Hong et al. ................... 437/42 |
| 5,619,052 A | 4/1997 | Chang et al. ................ 257/321 |
| 5,683,929 A | 11/1997 | Ohi et al. ...................... 437/60 |
| 5,882,978 A | 3/1999 | Srinivasan et al. ......... 438/396 |
| 5,981,404 A | 11/1999 | Sheng et al. ................. 438/791 |
| 5,998,253 A | 12/1999 | Loh et al. .................... 438/243 |
| 6,037,235 A | 3/2000 | Harwankar et al. ......... 438/396 |
| 6,040,207 A | 3/2000 | Gardner et al. ............. 438/216 |
| 6,117,763 A | 9/2000 | May et al. ................... 438/622 |
| 6,271,090 B1 * | 8/2001 | Huang et al. ............... 438/264 |
| 6,395,654 B1 * | 5/2002 | Yang et al. ................. 438/306 |
| 6,432,841 B1 * | 8/2002 | Li et al. ...................... 438/769 |

* cited by examiner

Primary Examiner—Michael Sherry
Assistant Examiner—Lisa Kilday
(74) Attorney, Agent, or Firm—Thomas Schneck

(57) ABSTRACT

A method for fabricating a silicon dioxide/silicon nitride/silicon dioxide (ONO) stacked composite having a thin silicon nitride layer for providing a high capacitance interpoly dielectric structure. In the formation of the ONO composite, a bottom silicon dioxide layer is formed on a substrate such as polysilicon. A silicon nitride layer is formed on the silicon dioxide-layer and is thinned by oxidation. The oxidation of the silicon nitride film consumes some of the silicon nitride by a reaction that produces a temporary silicon dioxide layer. The temporary silicon dioxide layer is removed with a hydrofluoric acid dilution. The silicon nitride layer is again thinned by re-oxidization as a top silicon dioxide layer is formed on the silicon nitride layer. A layer of polysilicon is deposited over the silicon nitride, forming an interpoly dielectric.

16 Claims, 2 Drawing Sheets

METHOD FOR FABRICATION OF A HIGH CAPACITANCE INTERPOLY DIELECTRIC

TECHNICAL FIELD

The present invention relates generally to a method of forming a dielectric composite, and more particularly to a method of forming a silicon nitride film of an ONO composite for use as an interpoly dielectric.

BACKGROUND ART

Interpoly dielectric structures comprising an ONO dielectric structure having silicon dioxide/silicon nitride/silicon dioxide layers are known in the art. ONO dielectrics are used in the fabrication of non-volatile memory devices such as EPROM, EEPROM, and FLASH and other capacitor devices.

As is known in the prior art, in general, nonvolatile memory devices comprise a series of memory cells. Each memory cell includes source and drain regions formed on the surface of a substrate, an insulating layer positioned between the source and drain regions, a floating gate on the insulating layer, a layer of insulating dielectric on the floating gate and a control gate on the insulating dielectric. The floating gate holds a charge and the insulating dielectric insulates the floating gate and assists it in maintaining its charge. A bit of binary data is stored in the floating gate. The value of the data is a function of the charge, therefore charge loss or gain can alter the value of the data. It is essential that each floating gate is capable of long-term charge retention.

The ability of a floating gate to retain its charge is primarily determined by the dielectric material used to insulate the floating gate. To prevent charge loss the dielectric must have a sufficiently high break down voltage to block electrons from the floating gate to the control gate when a high voltage potential is applied to the control gate during programming. Energy expended to introduce a charge into a floating gate is a function of the capacity between the floating gate and the control gate and is related to the thickness of the dielectric layer. Because capacitance is directly proportional to the dielectric constant and the surface area of the dielectric layer, increasing the surface area or decreasing the thickness of the dielectric layer will increase the capacitance of a memory cell. As the density of devices employing memory cells becomes smaller, the area that each device occupies becomes smaller. The resulting smaller devices are characterized by a lower capacitance. Therefore it is desirable to minimize the thickness of the insulating dielectric layer in order to minimize the energy needed to pass a charge in and out of a floating gate and to increase the device capacitance.

ONO dielectric composites have a silicon dioxide layer, a middle layer composed of silicon nitride covering the silicon dioxide layer and a layer of silicon dioxide covering the silicon nitride layer. Oxidation of the silicon nitride layer of an ONO composite thins the silicon nitride layer, thus minimizing the thickness of the insulating dielectric. U.S. Pat. No. 5,619,052 to Chang et al. provides during processing steps, such as oxidation of the nitride layer, the nitride layer should be made to be thinner than either oxide layer.

U.S. Pat. No. 5,504,021 to Hong et al. describes a method for fabricating an ONO stacked dielectric. The method involves depositing a thin nitride layer of a thickness of approximately 20 to 60 angstroms on the surface of a silicon substrate. The nitride layer is oxidized using a low-pressure dry-oxidation procedure to form the ONO stacked dielectric.

Unfortunately, as the thickness of the dielectric is reduced, charge leakage through pinholes and other defects present in the dielectric generally increases.

U.S. Pat. No. 5,882,978 to Srinivasan et al. provides a method for decreasing defects within the silicon nitride layer of a capacitor dielectric. The process involves forming a first layer of silicon nitride over a substrate. The silicon nitride has an outer surface having pinholes formed therein. The pinholes are widened with preferably a wet acid etching solution (for example phosphoric acid). A second layer comprising silicon is formed on the first layer and within the widened pinholes. The silicon of the second layer is nitridized into silicon nitride to form silicon nitride within the widened pinholes and to form a silicon nitride comprising layer, comprising silicon nitride of both the first and second layers.

With this method, the silicon nitride layer of the ONO dielectric composite is not reduced in thickness. As stated above, the thinner the dielectric layer, the greater the capacitance.

Therefore, it is an object of the present invention to provide a method for fabricating an ONO composite having a thinned silicon nitride layer with superior mechanical properties, such as fewer defects.

It is another object of the present invention to provide a method for fabricating an ONO composite having a thinned silicon nitride layer with superior electric properties.

It is another object of the present invention to provide a method to increase the capacitance provided by an interpoly dielectric.

It is a further object of the present invention to provide a method for fabricating an interpoly dielectric exhibiting a low leakage current and high reliability.

SUMMARY OF THE INVENTION

The present invention provides a method for fabricating a silicon dioxide/silicon nitride/silicon dioxide (ONO) stacked composite having the desirable characteristic of a thin silicon nitride layer with a reduced density of defects. A thin silicon nitride layer having a reduced density of defects helps to provide a high capacitance interpoly dielectric structure. Decreasing the thickness of the dielectric layer will increase the capacitance and reducing the density of defects will prevent current leakage from a floating gate of a memory cell, which is insulated by the dielectric structure.

In the formation of the ONO composite, a bottom or first silicon dioxide layer is formed on a substrate such as polysilicon. A silicon nitride layer is formed on the silicon dioxide layer and thinned by oxidation. The oxidation of the silicon nitride film consumes some of the silicon nitride by a reaction that produces a temporary silicon dioxide layer and ammonia. This temporary silicon dioxide layer is removed with a hydrofluoric acid dilution. The silicon nitride layer is again thinned by re-oxidization. A second silicon dioxide layer is grown on the silicon nitride layer. A second layer of polysilicon is deposited over the silicon nitride, forming an interpoly dielectric. Surprisingly, the resulting silicon nitride layer of the ONO dielectric is thinner and has fewer defects than an ONO dielectric having a silicon nitride layer of the same thickness thinned by conventional methods, thus providing a higher capacitance dielectric structure.

The dielectric structure formed by the present invention can be used in devices such as EEPROM, EPROM and FLASH cells and in other capacitor devices.

BEST MODE OF THE INVENTION

Figure 1A:
FIGS. 1(A)–1(E) show diagrammatically a silicon dioxide substrate during the formation of a thin ONO dielectric composite with the method of the present invention.
Figure 1B:
Figure 1C:
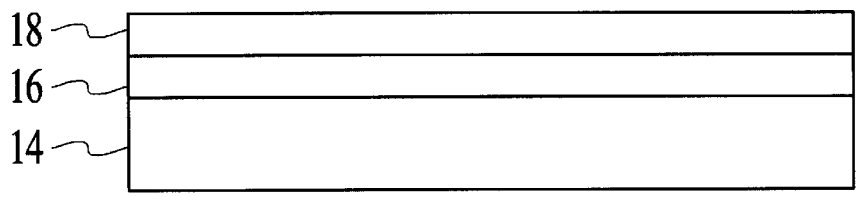
Figure 1D:
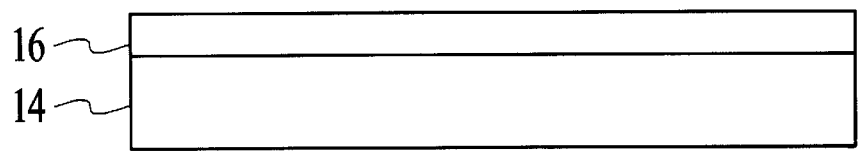

The following description provides the method of formation of the present invention of an ONO composite. FIG. 1A shows a first silicon dioxide layer 14. The silicon dioxide layer 14 may be formed by a variety of methods known in the art including for example thermal growth in a $O_2$ ambient environment, thermal growth in a $N_2O$ ambient environment, low temperature chemical vapor deposition (400° C.) and high temperature chemical vapor deposition (800–1000° C.). High temperature chemical vapor deposition may be preferred as it may produce an oxide film with a low concentration of defects. It also produces an oxide film that conforms to the surface of an underlying polysilicon layer 52 (shown in FIG. 2). The silicon dioxide layer can range in thickness from, for example, a few to a few hundred angstroms.

After formation of the bottom silicon dioxide layer 14, a silicon nitride layer 16 is formed on the silicon dioxide layer 14. The silicon nitride layer 16 may be formed on the bottom oxide layer 14 by a variety of methods known in the art including, for example, chemical vapor deposition and rapid thermal process (RTP). The nitride layer may be formed by for example, chemical vapor deposition using $SiH_2Cl_2/NH_3$ at between 650°–780° C.

After formation of the silicon nitride layer 16 the silicon nitride layer is oxidized. A temporary silicon dioxide layer 18 is thermally grown during oxidation of the nitride layer 16. The silicon dioxide layer 18 is thermally grown on the nitride layer 16 by a pyrogenic steam oxidation method known in the art using $H_2$ and $O_2$ gases at a temperature greater than >800° C. In another example, a dry oxidation process (known in the art) in an $O_2$ ambient environment or an $N_2O$ ambient environment is used for thermal growth of the silicon dioxide layer. Methods of deposition by chemical vapor deposition will not produce a thinning of the silicon nitride layer.

The oxidation of the silicon nitride layer consumes some of or thins the silicon nitride and produces silicon dioxide by the following reaction:

The oxidation process can vary for example, in length of time to produce silicon nitride films of varying thickness.

The resulting layer of silicon dioxide 18 is removed with a conventional oxide removal solution such as a hydrofluoric acid dilution. The dilution may be at room temperature, for example. A diluted solution is used to provide good process control. A common formulation of the dilution contains buffering agents, such as ammonium fluoride ($NH_4F$), which help prevent depletion of the fluoride ions, and thus maintain stable etching characteristics. Oxide removal takes place according to the overall equation:

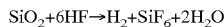

After the layer of silicon dioxide 18 is removed, and the silicon nitride 16 is thinned, the silicon nitride layer 16 is re-oxidized. A top oxide layer 20 is grown on the nitride layer 16 by a pyrogenic steam oxidation method as described above. In another example a dry oxidation process, as described above, is used for re-oxidation. Re-oxidation of the silicon nitride layer 16 thins the silicon nitride and produces the top layer of silicon dioxide 20. The silicon dioxide layer 20 can range in thickness from, for example, a few anstroms to hundreds of angstroms.

Figure 1E:
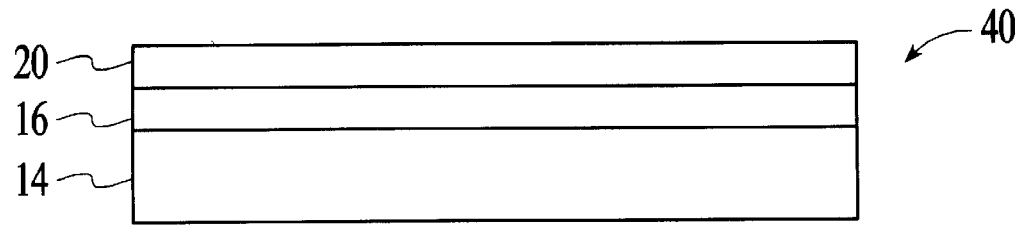
Figure 2:
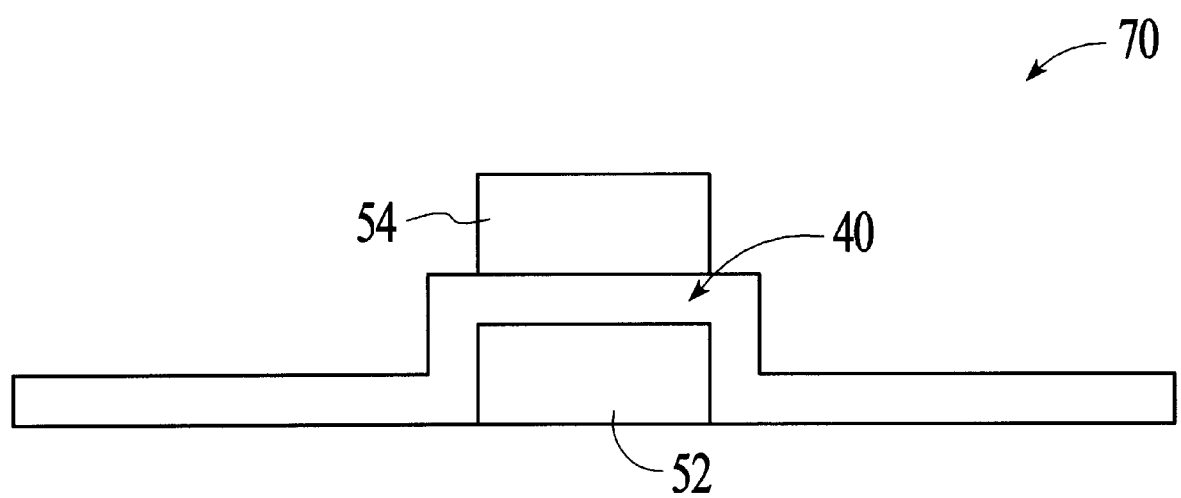
FIG. 2 is a diagram of an interpoly dielectric having an ONO dielectric formed by the method of the present invention show in FIGS. 1(A)–1(E).

The resulting ONO composite 40, pictured in FIG. 1E and FIG. 2, has a silicon nitride layer that has been thinned. The silicon nitride layer 16 is thinned twice, therefore, the initial thickness of the deposition of the silicon nitride should be thick enough to produce a desired end thickness after re-oxidation is complete. The thickness of the resulting silicon nitride layer 16 may range from, for example, a few to hundreds of angstroms.

The ONO composite 40, formed with the method of the present invention, is used in fabricating an interpoly dielectric structure, pictured in FIG. 2. During the process of the present invention the bottom silicon dioxide layer 14 (FIG. 1), of the ONO composite 40, may be formed on an underlying polysilicon layer 52 (FIG. 2) by deposition techniques or other techniques described above or known in the art. Next, deposition of the silicon nitride layer 16, oxidation of the silicon nitride layer 16, removal of the oxide 18 and reoxidation of the silicon nitride layer 16 occur as described above. A second polysilicon layer 54 is deposited on the top silicon dioxide layer 20 of the ONO composite 40, by methods known in the art, resulting in interpoly dielectric 70. The polysilicon layer 52 may form a floating gate and the polysilicon layer 54 may form a control gate for memory cells employed in various devices.

The method of the present invention results in an ONO composite having a thinned silicon nitride layer. Thin silicon nitride layers are advantageous because minimization of the thickness of the silicon nitride layer results in an enhancement of charge retention properties of the ONO composite. For instance, the silicon nitride layer of the present invention provides a greater capacitance than a silicon layer that has been deposited at the same resulting thickness or than a silicon nitride layer that has been thinned to the same resulting thickness using conventional techniques. Advantages of the invention also include the surprising result of a defect density of the silicon nitride layer that is lower than a defect density found in silicon nitride layers of ONO composites deposited at the same resulting thickness, or thinned to the same resulting thickness using conventional techniques.

The interpoly dielectric 70 (FIG. 2) fabricated by the method of the present invention has a high degree of structural integrity to prevent charge leakage and to provide a high capacitance level. The interpoly dielectric 70 is used in the fabrication of EPROM, EEPROM and FLASH devices and other resulting in reliable memory devices.

What is claimed is:

1. A method for forming an ONO dielectric, comprising:
    forming a silicon nitride layer on a first silicon dioxide layer;
    oxidizing said silicon nitride layer, producing a temporary layer of silicon dioxide on said silicon nitride layer;
    removing said temporary silicon dioxide layer;
    re-oxidizing the silicon nitride layer, forming a second silicon dioxide layer on said silicon nitride layer.

2. The method of claim 1 wherein said temporary silicon dioxide is removed with a hydrofluoric acid dilution.

3. The method of claim 2 wherein said hydrofluoric acid dilution is at room temperature.

4. The method of claim 2 wherein said acid dilution includes a buffering agent.

5. The method of claim 4 wherein said buffering agent is ammonium fluoride.

6. The method of claim 1 wherein said oxidation thins said silicon nitride layer.

7. The method of claim 1 wherein said resulting silicon nitride layer has a reduced density of defects.

8. The method of claim 1 wherein said ONO dielectric is located within an interpoly dielectric structure.

9. The method of claim 8 wherein said first silicon dioxide layer is formed on a polysilicon substrate.

10. The method of claim 9 wherein a layer of polysilicon is deposited on said second silicon dioxide layer.

11. The method of claim 9 wherein forming said first layer of silicon dioxide occurs by oxidation of said polysilicon substrate.

12. The method of claim 1 wherein forming a silicon nitride layer occurs by depositing a nitride film on the first silicon dioxide layer.

13. The method of claim 12 wherein said deposition occurs by chemical vapor deposition.

14. The method of claim 1 wherein said oxidation occurs by a dry oxidation process.

15. The method of claim 1 wherein said re-oxidation occurs by a dry oxidation process.

16. A method for fabricating a high capacitance interpoly dielectric structure, comprising:

forming a first layer of silicon dioxide on a polysilicon substrate;

forming a layer of silicon nitride on the silicon dioxide;

oxidizing the silicon nitride layer, forming a temporary silicon dioxide layer on said silicon nitride layer;

removing said temporary silicon dioxide layer;

re-oxidizing said silicon nitride layer, forming a second silicon dioxide layer; and depositing a polysilicon layer on said second silicon dioxide layer.

* * * * *